United States Patent
Shim et al.

(10) Patent No.: US 9,305,854 B2
(45) Date of Patent: Apr. 5, 2016

(54) SEMICONDUCTOR DEVICE AND METHOD OF FORMING RDL USING UV-CURED CONDUCTIVE INK OVER WAFER LEVEL PACKAGE

(71) Applicant: STATS ChipPAC, Ltd., Singapore (SG)

(72) Inventors: Il Kwon Shim, Singapore (SG); Jun Mo Koo, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 24 days.

(21) Appl. No.: 13/795,679

(22) Filed: Mar. 12, 2013

(65) Prior Publication Data

US 2014/0054802 A1     Feb. 27, 2014

Related U.S. Application Data

(60) Provisional application No. 61/691,651, filed on Aug. 21, 2012.

(51) Int. Cl.
*H01L 23/48* (2006.01)
*H01L 23/28* (2006.01)
(Continued)

(52) U.S. Cl.
CPC ............ *H01L 23/28* (2013.01); *H01L 21/4853* (2013.01); *H01L 21/56* (2013.01);
(Continued)

(58) Field of Classification Search
CPC ............... H01L 21/56; H01L 21/4853; H01L 23/76802; H01L 23/3121; H01L 23/3128; H01L 23/5389; H01L 23/5328; H01L 24/03; H01L 24/11; H01L 24/19; H01L 2224/0239; H01L 2224/0401

USPC .......... 438/612–617, 629, 630, 637–640, 66, 438/672, 126, 610, 667, 119, 631, 642, 758, 438/127; 257/737, 738, 774, E23.021, 257/E23.069, E21.597, 693, 698, 736, 773, 257/E23.011, E23.018, 781, 787, 734, 257/E23.116, E21.502

See application file for complete search history.

(56) References Cited

U.S. PATENT DOCUMENTS 4,049,844 A    9/1977    Bolon et al.
4,088,801 A    5/1978    Bolon et al.
(Continued)

FOREIGN PATENT DOCUMENTS

JP        5222326 A       8/1993
JP    2004288973 A      10/2004

*Primary Examiner* — Jasmine Clark
(74) *Attorney, Agent, or Firm* — Robert D. Atkins; Patent Law Group: Atkins and Associates, P.C.

(57) ABSTRACT

A semiconductor device has a semiconductor die and first insulating layer formed over the semiconductor die. A patterned trench is formed in the first insulating layer. A conductive ink is deposited in the patterned trench by disposing a stencil over the first insulating layer with an opening aligned with the patterned trench and depositing the conductive ink through the opening in the stencil into the patterned trench. Alternatively, the conductive ink is deposited by dispensing the conductive ink through a nozzle into the patterned trench. The conductive ink is cured by ultraviolet light at room temperature. A second insulating layer is formed over the first insulating layer and conductive ink. An interconnect structure is formed over the conductive ink. An encapsulant can be deposited around the semiconductor die. The patterned trench is formed in the encapsulant and the conductive ink is deposited in the patterned trench in the encapsulant.

26 Claims, 10 Drawing Sheets

(51) Int. Cl.
*H01L 21/56* (2006.01)
*H01L 23/31* (2006.01)
*H01L 23/00* (2006.01)
*H01L 21/48* (2006.01)
*H01L 23/532* (2006.01)
*H01L 23/538* (2006.01)
*H01L 23/525* (2006.01)

(52) U.S. Cl.
CPC ......... *H01L 21/561* (2013.01); *H01L 23/3114* (2013.01); *H01L 23/5328* (2013.01); *H01L 23/5389* (2013.01); *H01L 24/03* (2013.01); *H01L 24/11* (2013.01); *H01L 24/19* (2013.01); *H01L 24/96* (2013.01); *H01L 21/568* (2013.01); *H01L 23/3128* (2013.01); *H01L 23/525* (2013.01); *H01L 2224/0239* (2013.01); *H01L 2224/02311* (2013.01); *H01L 2224/0401* (2013.01); *H01L 2224/04042* (2013.01); *H01L 2224/04105* (2013.01); *H01L 2224/1134* (2013.01); *H01L 2224/12105* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/181* (2013.01); *H01L 2924/18162* (2013.01)

(56) References Cited

U.S. PATENT DOCUMENTS

| | | | |
|---|---|---|---|
| 4,401,686 A | 8/1983 | Durand | |
| 5,781,124 A * | 7/1998 | Chouteau | 340/2.2 |
| 7,575,999 B2 * | 8/2009 | Benson et al. | 438/637 |
| 7,722,422 B2 * | 5/2010 | Cok | 445/23 |
| 8,258,633 B2 * | 9/2012 | Sezi et al. | 257/782 |
| 2006/0188823 A1 | 8/2006 | Jackson et al. | |
| 2006/0278853 A1 | 12/2006 | Yang | |
| 2009/0039496 A1 * | 2/2009 | Beer et al. | 257/693 |
| 2009/0293766 A1 | 12/2009 | Kamikoriyama et al. | |
| 2011/0143051 A1 * | 6/2011 | Ohashi et al. | 427/553 |
| 2012/0056332 A1 | 3/2012 | Rathburn | |
| 2012/0111619 A1 | 5/2012 | Amago | |
| 2012/0168942 A1 * | 7/2012 | Gan et al. | 257/738 |
| 2013/0175556 A1 * | 7/2013 | Ray et al. | 257/88 |

\* cited by examiner

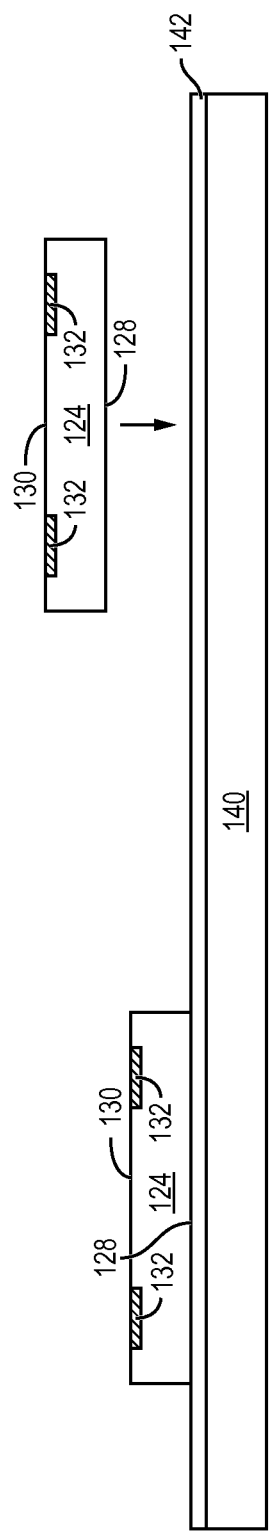
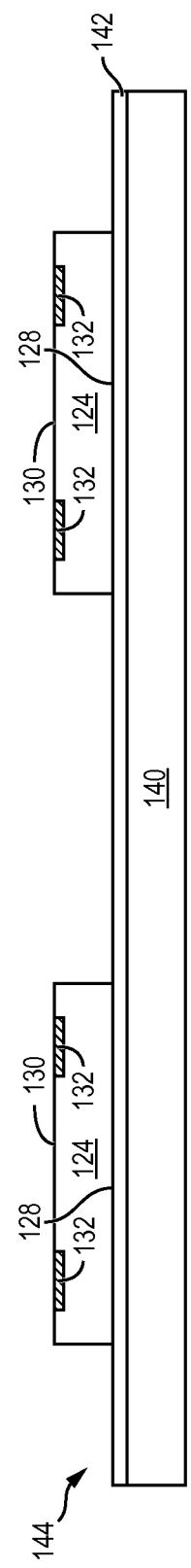
FIG. 5a
FIG. 5b

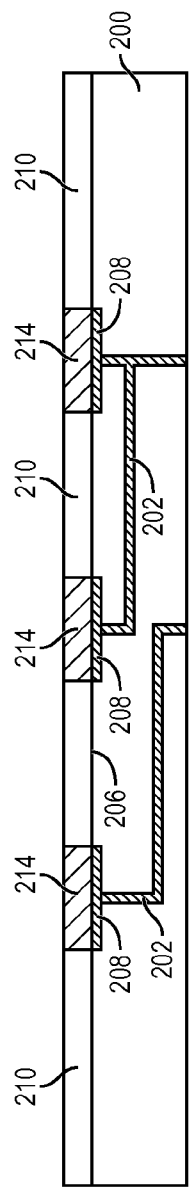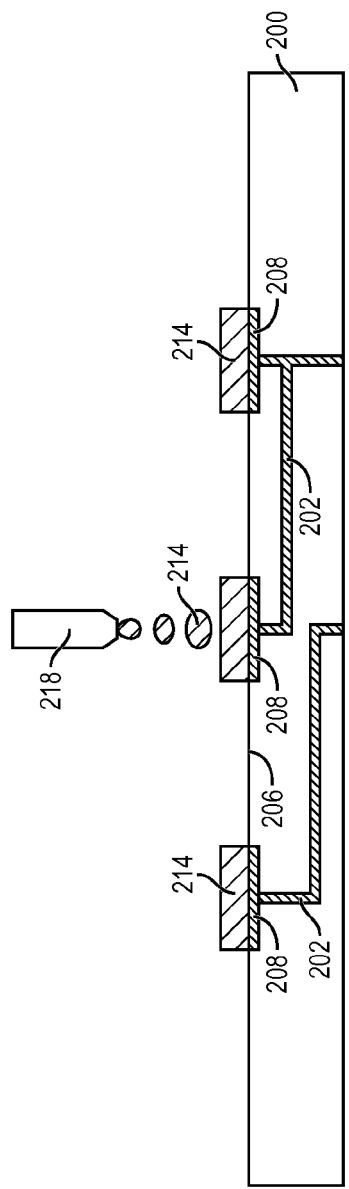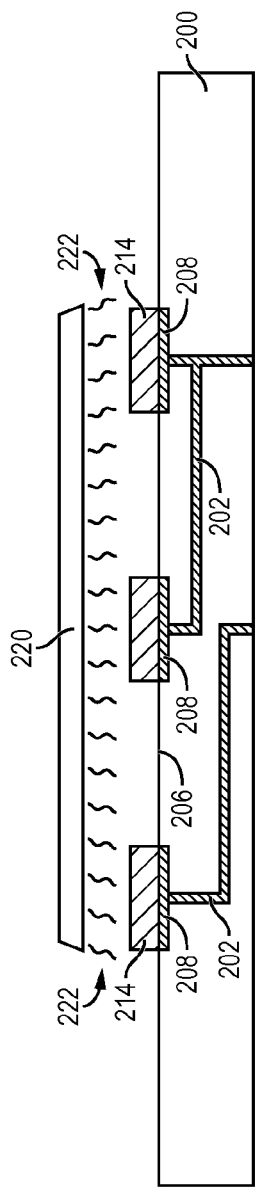

SEMICONDUCTOR DEVICE AND METHOD OF FORMING RDL USING UV-CURED CONDUCTIVE INK OVER WAFER LEVEL PACKAGE

CLAIM TO DOMESTIC PRIORITY

The present application claims the benefit of U.S. Provisional Application No. 61/691,651, filed Aug. 21, 2012, which application is incorporated herein by reference.

FIELD OF THE INVENTION

The present invention relates in general to semiconductor devices and, more particularly, to a semiconductor device and method of forming an RDL using UV-cured conductive ink over wafer level package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

FIG. 1a shows a portion of a reconstituted semiconductor wafer 10 including semiconductor die 12. A contact pad 14 is formed over an active surface of semiconductor die 12 with electrical connection to circuits in the active surface. An insulating or passivation layer 16 is formed over semiconductor die 12. An encapsulant 18 is deposited around semiconductor die 12 as part of reconstituted wafer 10. In FIG. 1b, a dielectric layer 20 is formed over insulating layer 16 and encapsulant 18. An opening 22 is formed in dielectric layer 20 to expose contact pad 14. In FIG. 1c, a multi-layer redistribution layer (RDL) is formed over dielectric layer 20 and into opening 22 to contact pad 14. The RDL includes conductive layer 24 conformally applied to dielectric layer 20 and into opening 22 to contact pad 14, and conductive layer 26 conformally applied to conductive layer 24. In FIG. 1d, a dielectric layer 28 is formed over dielectric layer 20 and conductive layers 24 and 26.

As described in FIGS. 1a-1d, the RDL requires several processes, including spin coating to form the dielectric layers and plating to form the conductive layers in accordance with standard photoresist procedures. The formation of the dielectric layers and conductive layers is time consuming and requires access to expensive and complex semiconductor processing equipment, such as a plating tool. In addition, the formation of the dielectric layers and conductive layers is difficult to achieve over a large semiconductor die area or large portion of the reconstituted wafer.

SUMMARY OF THE INVENTION

A need exists for a simple and cost effective way to form RDLs over a semiconductor die, substrate, or reconstituted wafer. Accordingly, in one embodiment, the present invention is a method of making a semiconductor device comprising the steps of providing a semiconductor die, forming a first insulating layer over the semiconductor die, forming a patterned trench in the first insulating layer, depositing a conductive ink in the patterned trench, and curing the conductive ink by ultraviolet light.

In another embodiment, the present invention is a method of making a semiconductor device comprising the steps of providing a substrate, forming a first insulating layer over the substrate, forming a trench in the first insulating layer, depositing a conductive ink in the trench, and curing the conductive ink.

In another embodiment, the present invention is a semiconductor device comprising a semiconductor die and first insulating layer formed over the semiconductor die. A patterned trench is formed in the first insulating layer. A conductive ink is deposited in the patterned trench. The conductive ink is cured by ultraviolet light.

In another embodiment, the present invention is a semiconductor device comprising a substrate and first insulating layer formed over the substrate. A trench is formed in the first insulating layer. A conductive ink is deposited in the trench. The conductive ink is cured.

BRIEF DESCRIPTION OF THE DRAWINGS

FIGS. 5a-5b illustrate mounting the semiconductor die to a carrier to form a reconstituted wafer;

FIGS. 8a-8d illustrate a process of forming a wiring trace or RDL over a substrate using UV-cured conductive ink.

DETAILED DESCRIPTION OF THE DRAWINGS

Figure 1A:
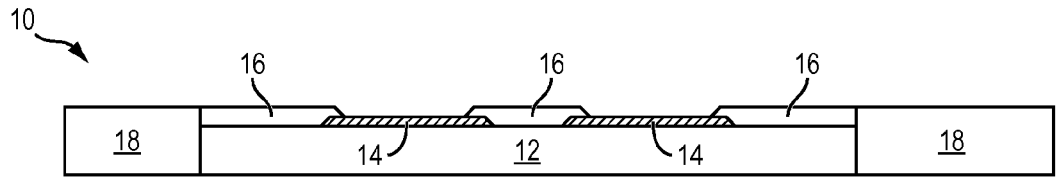
FIGS. 1a-1d illustrate a conventional process of forming an RDL over a reconstituted wafer.
Figure 1B:
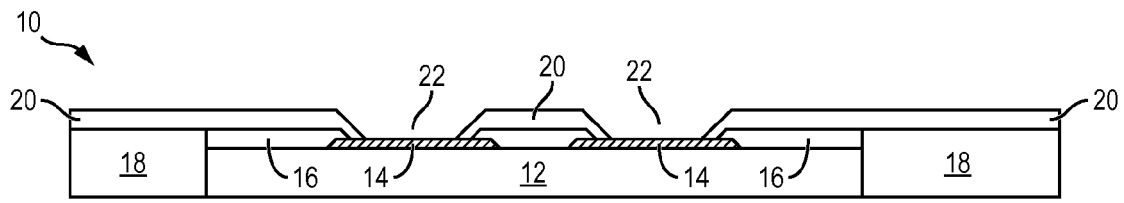
Figure 1C:
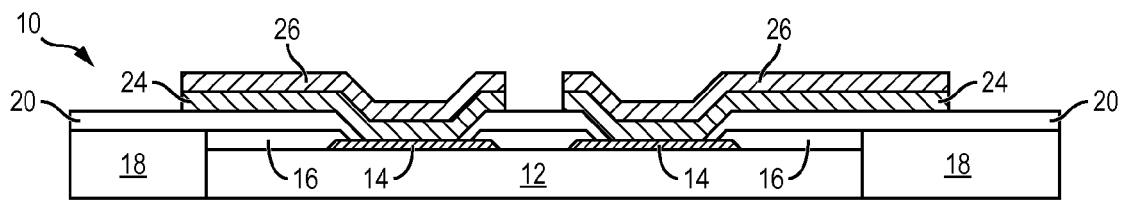
Figure 1D:
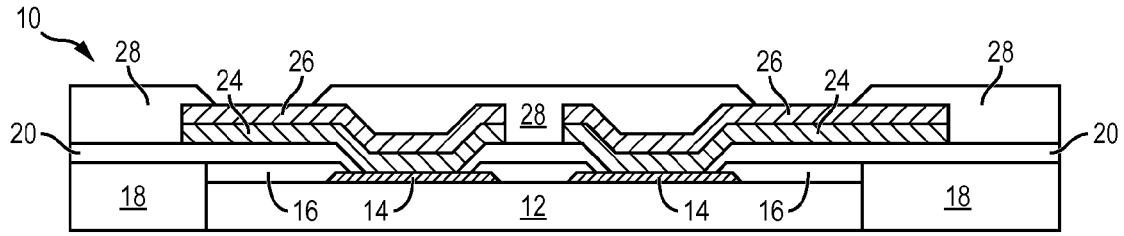

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
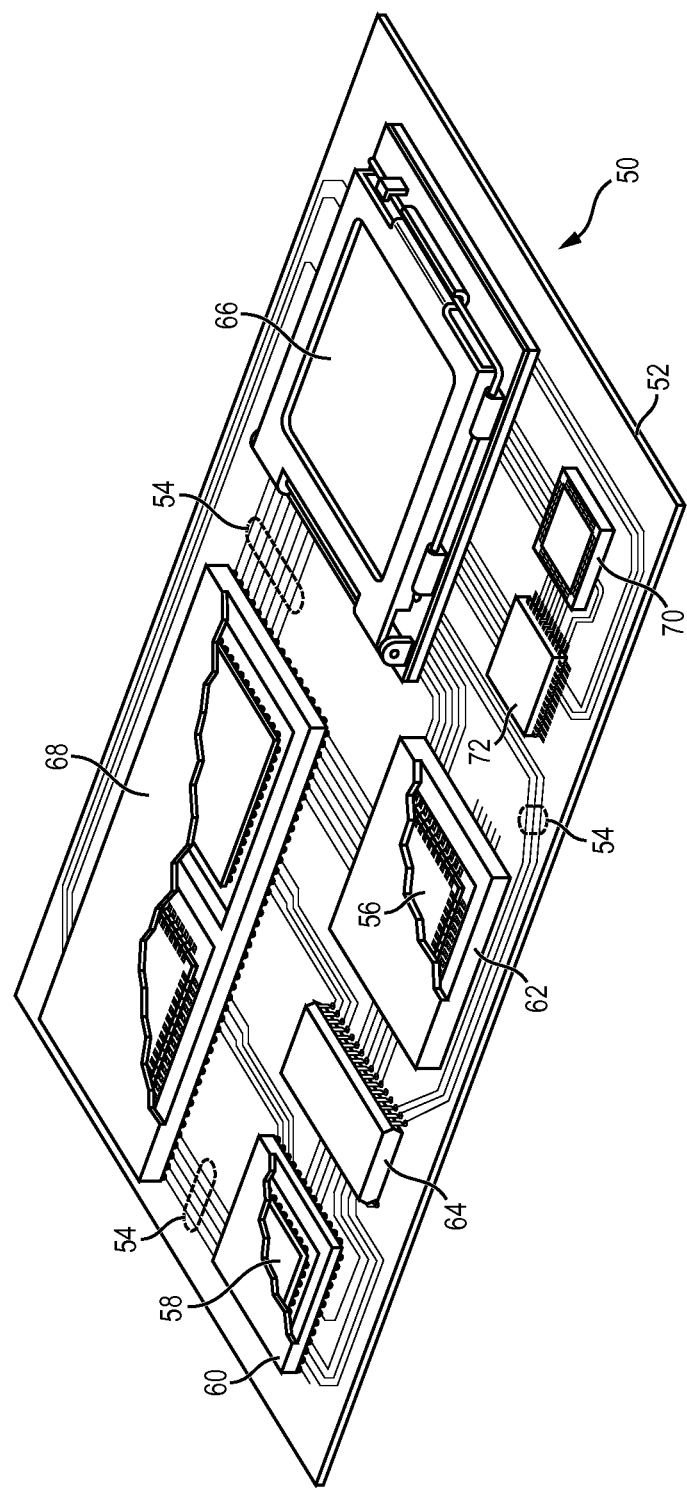
FIG. 2 illustrates a printed circuit board (PCB) with different types of packages mounted to its surface.

FIG. 2 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 3A:
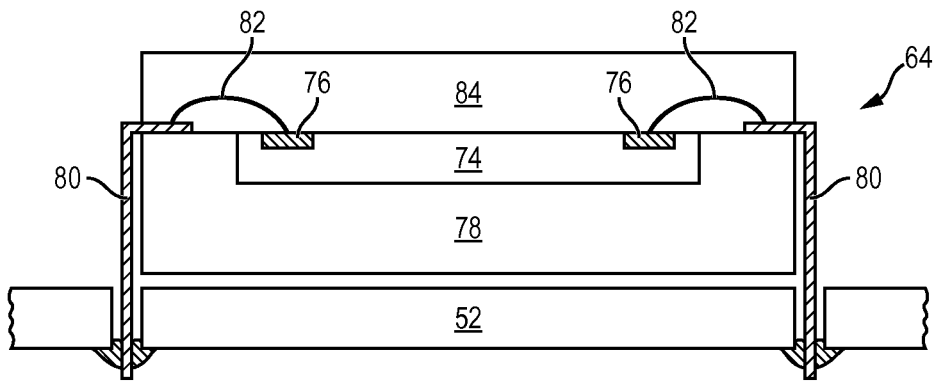
FIGS. 3a-3c illustrate further detail of the representative semiconductor packages mounted to the PCB.
Figure 3B:
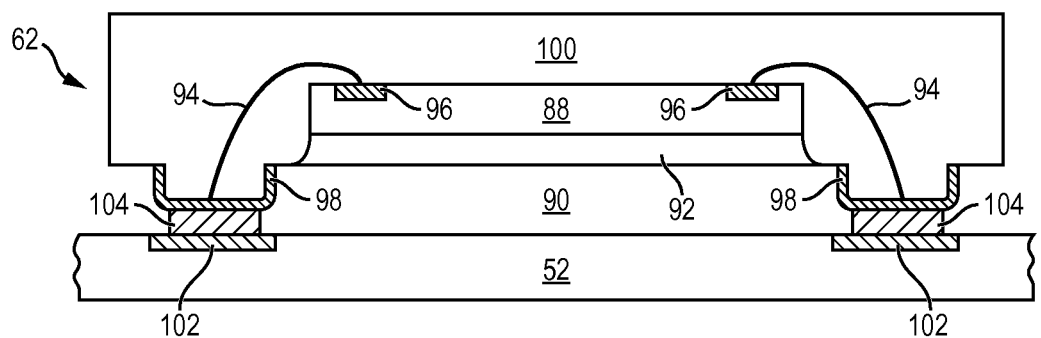
Figure 3C:
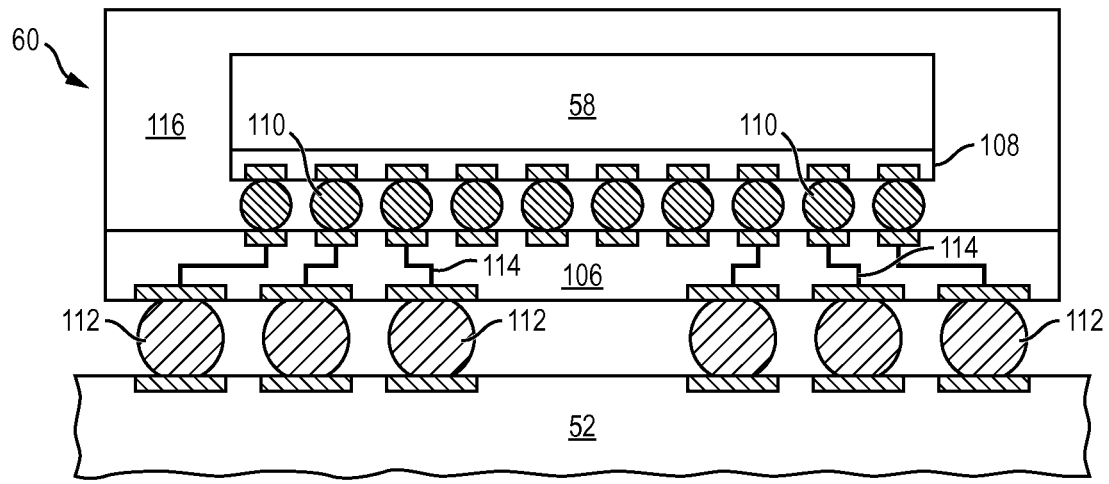

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 3b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 4A:
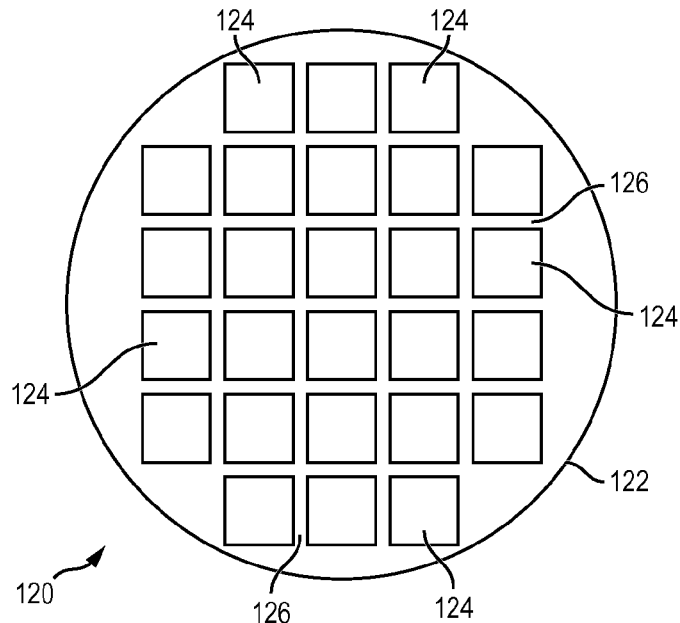
FIGS. 4a-4c illustrate a semiconductor wafer with a plurality of semiconductor die separated by a saw street.

FIG. 4a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 4B:
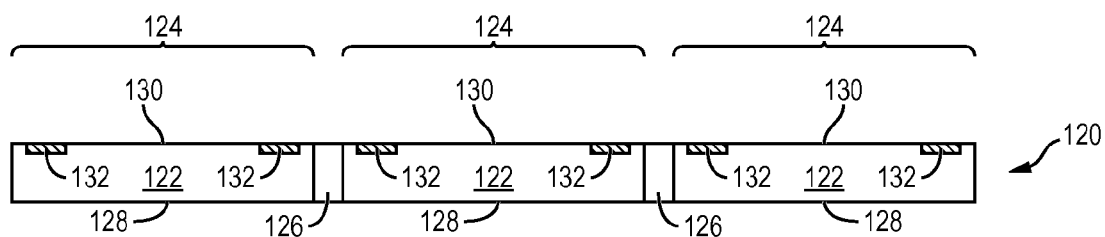

FIG. 4b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 4b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Figure 4C:
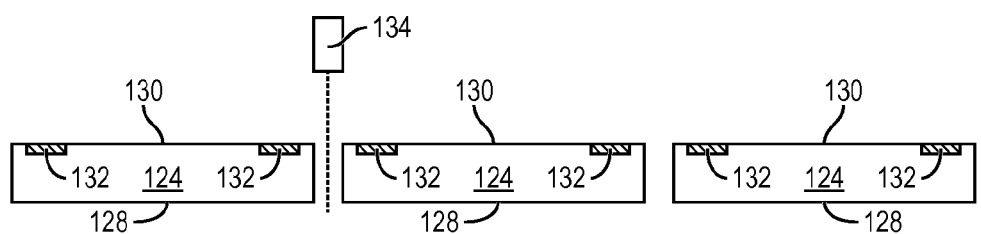

In FIG. 4c, semiconductor wafer 120 is singulated through saw street 126 using a saw blade or laser cutting tool 134 into individual semiconductor die 124.

FIG. 5a shows a cross-sectional view of substrate or carrier 140 containing temporary or sacrificial base material such as silicon, germanium, gallium arsenide, indium phosphide, silicon carbide, resin, beryllium oxide, glass, or other suitable low-cost, rigid material for structural support. An interface layer or double-sided tape 142 is formed over carrier 140 as a temporary adhesive bonding film, etch-stop layer, or release layer. Semiconductor die 124 from FIGS. 3a-3c are positioned over and mounted to interface layer 142 and carrier 140 using, for example, a pick and place operation with back surface 128 oriented toward the carrier. FIG. 5b shows a plurality of semiconductor die 124, potentially hundreds of die, mounted to carrier 140 as reconstituted wafer 144 to fabricate high density embedded wafer level ball grid array (eWLB) packages.

Figure 6A:
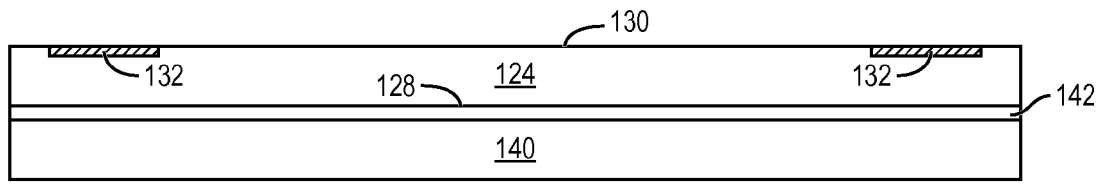
FIGS. 6a-6i illustrate a process of forming an RDL over a semiconductor die using UV-cured conductive ink.
Figure 6B:
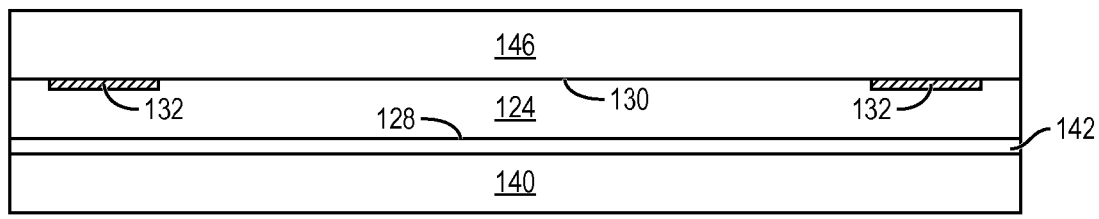

FIGS. 6a-6i illustrate, in relation to FIGS. 2 and 3a-3c, a processing of forming an RDL or wiring trace over a semiconductor die using UV-cured conductive ink. FIG. 6a shows a portion of reconstituted wafer 144 associated with one semiconductor die 124. In FIG. 6b, an insulating or dielectric layer 146 is formed over active surface 130 and conductive layer 132 of semiconductor die 124 using PVD, CVD, laminating, printing, spin coating, spray coating, sintering, or thermal oxidation. The insulating layer 146 includes one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), or other material having similar structural and insulating properties. The insulating layer 146 can be organic or inorganic base material. The insulating layer 146 is cured at 180-200° C. for 1.5-2.0 hours.

Figure 6C:
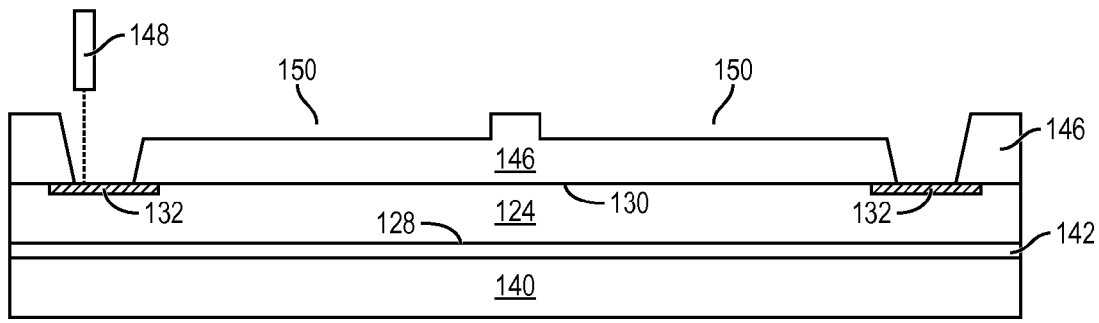

In FIG. 6c, a portion of insulating layer 146 is removed by laser direct ablation (LDA) using infrared (IR) or ultraviolet (UV) laser 148 to expose conductive layer 132 and define pattern cavity or trench 150 into the insulating layer for a later formed RDL. Alternatively, a portion of insulating layer 146 is removed by an etching process through a patterned photoresist layer to expose conductive layer 132 and define a pattern or path 150 into the insulating layer for the later RDL formation.

Figure 6D:
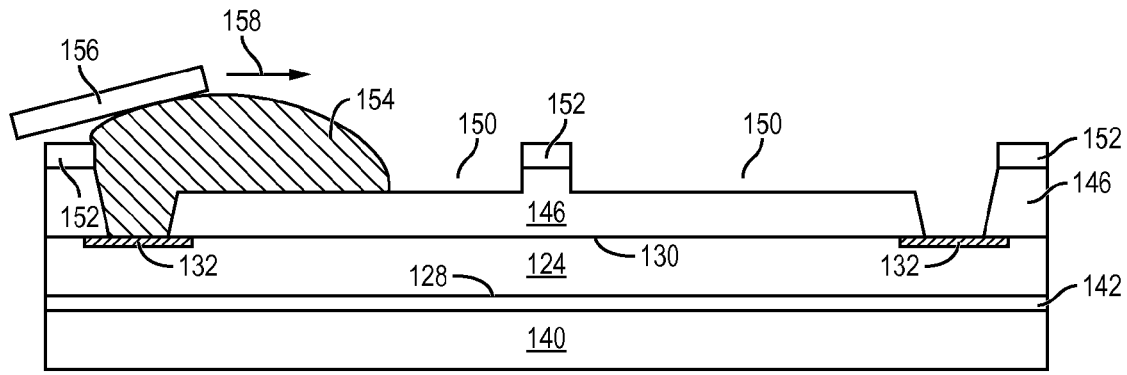

In FIG. 6d, a screen or stencil 152 is disposed over insulating layer 146 with one or more openings in the stencil aligned to patterned trench 150. A volume of conductive ink 154 is deposited over stencil 152 and insulating layer 146 in a printing process. In one embodiment, conductive ink 154 contains powdered or flaked silver or carbon conductive materials applied as a thin layer in patterned trench 150. A conductive ink distribution tool or squeegee 156 distributes conductive ink 154 across stencil 152 and into patterned trench 150. During the printing operation, conductive ink distribution tool 156 moves left to right across stencil 152 as shown by arrow 158 to press conductive ink 154 through the openings in the stencil into patterned trench 150 in insulating layer 146.

Figure 6E:
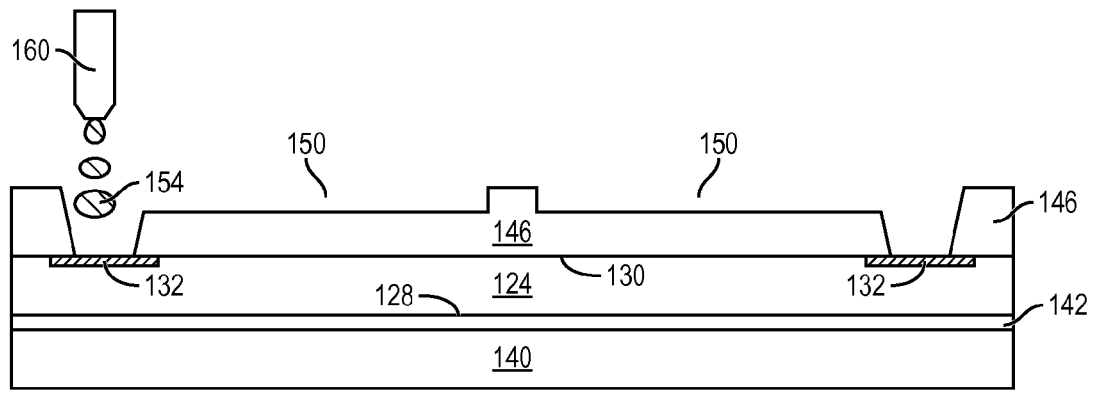

In another embodiment, a volume of conductive ink 154 is deposited directly into patterned trench 150 in insulating layer 146 using dispensing nozzle or jet 160, as shown in FIG. 6e. During the jetting operation, conductive ink 154 flows from dispensing nozzle 160 as droplets or steady stream in the proper volume to fill patterned trench 150. The volume of conductive ink 154 is measured according to the space requirements of patterned trench 150.

Figure 6F:
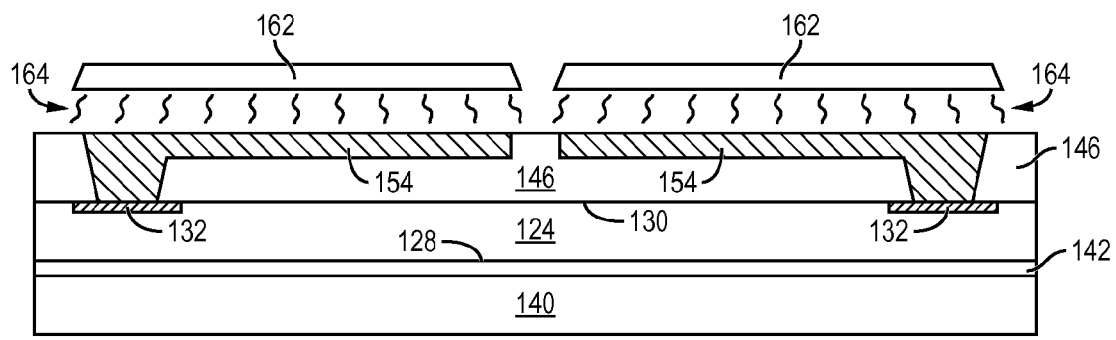

FIG. 6f shows conductive ink 154 deposited into patterned trench 150 in insulating layer 146 by operation of conductive ink distribution tool 156, dispensing nozzle 160, or other suitable applicator for dispensing or distributing the conductive ink. Conductive ink 154 is evenly dispensed and uniformly distributed within patterned trench 150 in insulating layer 146. Excess conductive ink 154 can be removed by a planarizing operation on insulating layer 146 to make the conductive ink planar with the insulating layer.

An ultraviolet (UV) light source 162 radiates UV light 164 onto conductive ink 154 at room temperature (15-25° C.) causing a chemical crosslinking reaction to cure the conductive ink. An elevated temperature is not required for the UV cure of conductive ink 154.

Figure 6G:
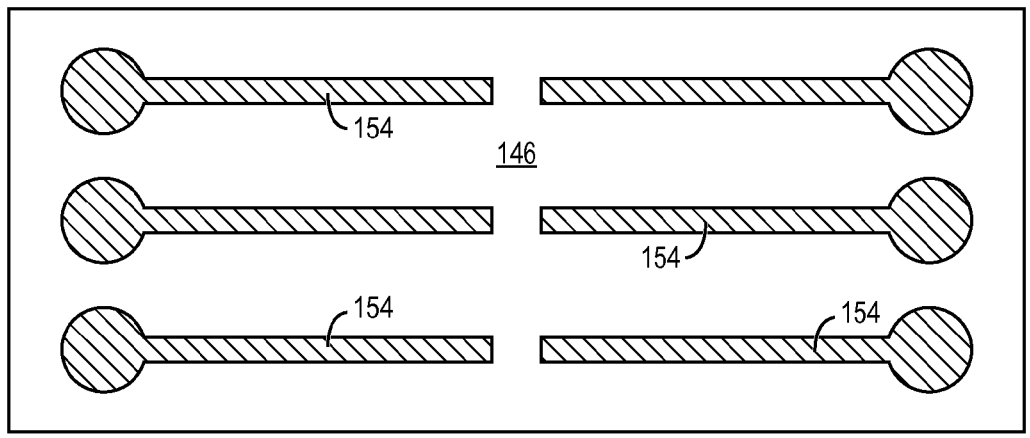

FIG. 6g shows a plan view of conductive ink 154 deposited into patterned trench 150 in insulating layer 146 as RDLs. The radiation curable conductive ink 154 can be applied at the wafer level, i.e., either at the manufacturing step of FIG. 4a (semiconductor wafer) or FIG. 5b (reconstituted wafer). Conductive ink 154 is disposed in patterned trench 150 of insulating layer 146 by screen printing, ink jetting, or other suitable dispensing process and then cured by UV light at room temperature.

Figure 6H:
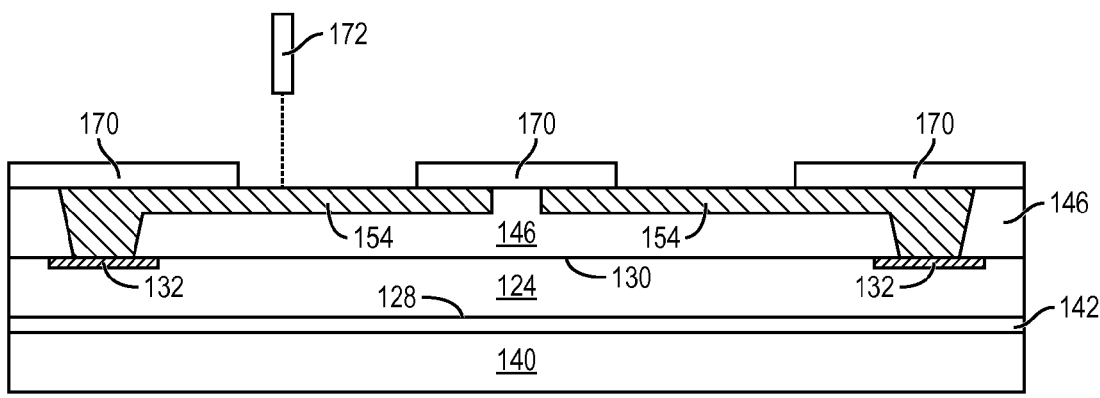

In FIG. 6h, an insulating or passivation layer 170 is formed over insulating layer 146 and conductive ink 154 using PVD, CVD, laminating, printing, spin coating, spray coating, sintering, or thermal oxidation. The insulating layer 170 includes one or more layers of SiO2, Si3N4, SiON, Ta2O5, Al2O3, HfO2, or other material having similar structural and insulating properties. A portion of insulating layer 170 is removed by LDA using laser 172 to expose conductive ink 154. Alternatively, a portion of insulating layer 170 is removed by an etching process through a patterned photoresist layer to expose conductive ink 154.

Figure 6I:
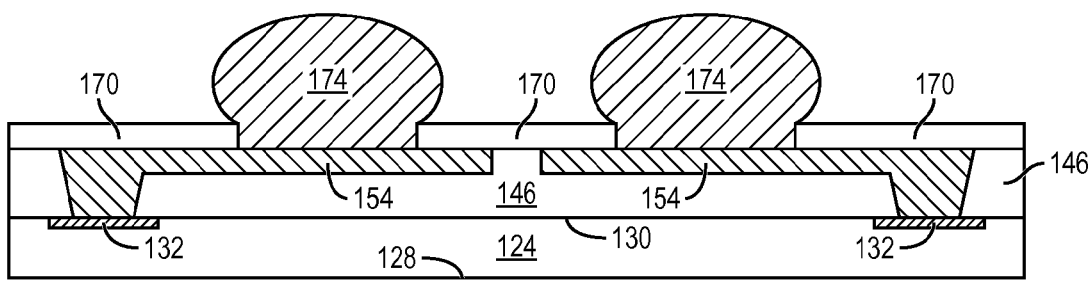

In FIG. 6i, an electrically conductive bump material is deposited over conductive ink 154 using an evaporation, electrolytic plating, electroless plating, ball drop, or screen printing process. The bump material can be Al, Sn, Ni, Au, Ag, lead (Pb), Bi, Cu, solder, and combinations thereof, with an optional flux solution. For example, the bump material can be eutectic Sn/Pb, high-lead solder, or lead-free solder. The bump material is bonded to conductive ink 154 using a suitable attachment or bonding process. In one embodiment, the bump material is reflowed by heating the material above its melting point to form balls or bumps 174. In some applications, bumps 174 are reflowed a second time to improve electrical contact to conductive ink 154. In one embodiment, bumps 174 are formed over a UBM having a wetting layer, barrier layer, and adhesive layer. The bumps can also be compression bonded or thermocompression bonded to conductive ink 154. Bumps 174 represent one type of interconnect structure that can be formed over conductive ink 154. The interconnect structure can also use bond wires, conductive paste, stud bump, micro bump, or other electrical interconnect.

Carrier 140 and interface layer 142 are removed by chemical etching, mechanical peeling, chemical mechanical planarization (CMP), mechanical grinding, thermal bake, UV light, laser scanning, or wet stripping.

The description of FIGS. 6a-6i is simple, fast, low cost, and applies to a portion of semiconductor wafer 120 or reconstituted wafer 144, or a large area, e.g., the entirety, of the semiconductor wafer or reconstituted wafer. The cured conductive ink 154 provides RDL or wiring traces to electrically connect electronic circuits within active surface 130 of semiconductor die 124, as well as external devices. In one embodiment, the cured RDL 154 has electrical resistivity of 10-3 ohms centimeters (Ωcm).

Figure 7A:
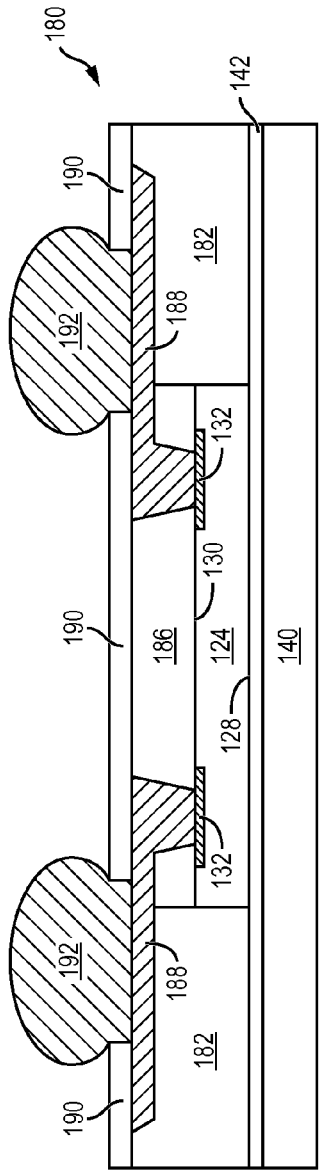
FIGS. 7a-7b illustrate an eWLB having an RDL formed in the encapsulant by UV-cured conductive ink.
Figure 7B:
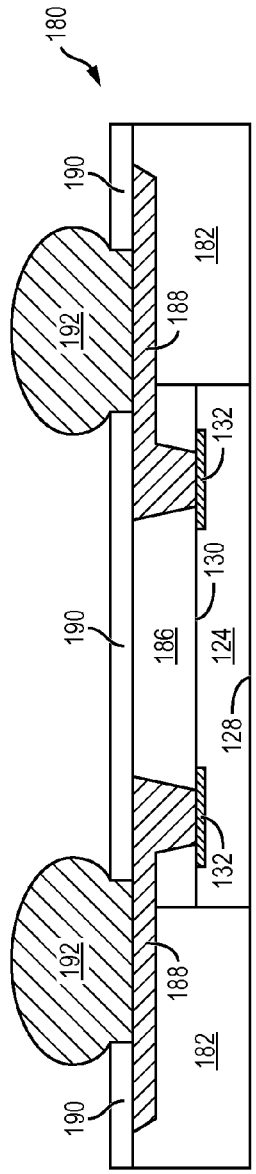

FIGS. 7a-7b illustrate an embodiment including RDL formed with conductive ink for eWLB 180, shown as a portion of reconstituted wafer 144 associated with one semiconductor die 124. In FIG. 7a, an encapsulant or molding compound 182 is deposited around semiconductor die 124 over carrier 140 using a paste printing, compressive molding, transfer molding, liquid encapsulant molding, vacuum lamination, spin coating, or other suitable applicator. Encapsulant 182 can be polymer composite material, such as epoxy resin with filler, epoxy acrylate with filler, or polymer with proper filler. Encapsulant 182 is non-conductive and environmentally protects the semiconductor device from external elements and contaminants.

An insulating or dielectric layer 186 is formed over active surface 130 and conductive layer 132 of semiconductor die 124 using PVD, CVD, laminating, printing, spin coating, spray coating, sintering, or thermal oxidation. The insulating layer 186 includes one or more layers of SiO2, Si3N4, SiON, Ta2O5, Al2O3, HfO2, BCB, PI, PBO, or other material having similar structural and insulating properties. The insulating layer 186 can be organic or inorganic base material. The insulating layer 186 is cured at 180-200° C. for 1.5-2.0 hours.

A portion of encapsulant 182 and insulating layer 186 is removed by LDA to expose conductive layer 132 and define the patterned trench into the insulating layer for a later formed RDL, similar to FIG. 6c. Alternatively, a portion of encapsulant 182 and insulating layer 186 is removed by an etching process through a patterned photoresist layer to expose conductive layer 132 and define a pattern or path into the insulating layer for the later RDL formation.

A volume of conductive ink 188 is deposited into the patterned trench in encapsulant 182 and insulating layer 186 using a printing or jetting process, similar to FIGS. 6d and 6e, or other suitable application process. In one embodiment, conductive ink 188 contains powdered or flaked silver or carbon conductive materials applied as a thin layer in the patterned trench. The volume of conductive ink 188 is measured according to the space requirements of the patterned trench. The radiation curable conductive ink 188 can be applied at the wafer level. Excess conductive ink 188 can be removed by a planarizing operation on encapsulant 182 and insulating layer 186 to make the conductive ink planar with the encapsulant and insulating layer. Conductive ink 188 is radiated with UV light at room temperature causing a chemical crosslinking reaction to cure the conductive ink as RDL. An elevated temperature is not required for the UV cure of conductive ink 188.

An insulating or passivation layer 190 is formed over encapsulant 182, insulating layer 186, and conductive ink 188 using PVD, CVD, laminating, printing, spin coating, spray coating, sintering, or thermal oxidation. The insulating layer 190 includes one or more layers of SiO2, Si3N4, SiON, Ta2O5, Al2O3, HfO2, or other material having similar structural and insulating properties. A portion of insulating layer 190 is removed by LDA to expose conductive ink 188. Alternatively, a portion of insulating layer 190 is removed by an etching process through a patterned photoresist layer to expose conductive ink 188.

An electrically conductive bump material is deposited over conductive ink 188 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive ink 188 using a suitable attachment or bonding process. In one embodiment, the bump material is reflowed by heating the material above its melting point to form balls or bumps 192. In some applications, bumps 192 are reflowed a second time to improve electrical contact to conductive ink 188. In one embodiment, bumps 192 are formed over a UBM having a wetting layer, barrier layer, and adhesive layer. The bumps can also be compression bonded or thermocompression bonded to conductive ink 188. Bumps 192 represent one type of interconnect structure that can be formed over conductive ink 188. The interconnect structure can also use bond wires, conductive paste, stud bump, micro bump, or other electrical interconnect.

In FIG. 7b, carrier 140 and interface layer 142 are removed by chemical etching, mechanical peeling, chemical mechanical planarization (CMP), mechanical grinding, thermal bake, UV light, laser scanning, or wet stripping.

The formation of RDL using conductive ink 188 is simple, fast, low cost, and applies to a portion of reconstituted wafer 144 or a large area, e.g., the entirety, of the reconstituted wafer. The cured conductive ink 188 provides RDL or wiring traces to electrically connect electronic circuits within active surface 130 of semiconductor die 124, as well as external devices.

Figure 8A:
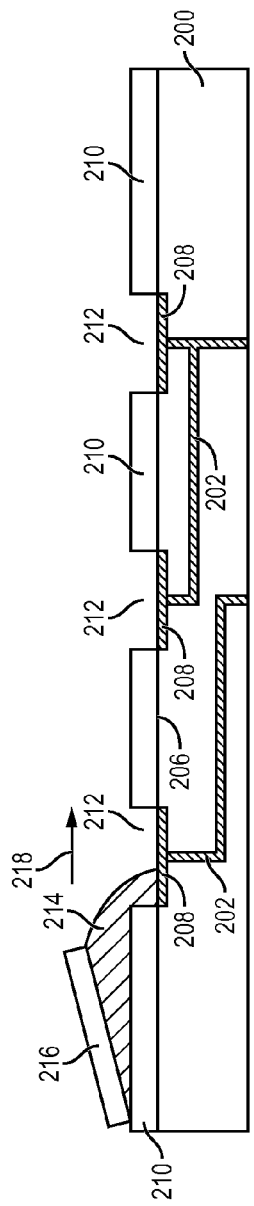

FIGS. 8a-8d illustrate, in relation to FIGS. 2 and 3a-3c, a processing of forming an RDL or wiring trace over a substrate using UV-cured conductive ink. FIG. 8a shows a substrate 200 including an interconnect structure 202 comprising one or more layers of Al, Cu, Sn, Ni, Au, Ag, or other suitable electrically conductive material enabling vertical and lateral conduction through the substrate. In another embodiment, substrate 200 has a back surface 204 and active surface 206 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 206 to implement analog circuits or digital circuits, such as DSP, ASIC, memory, or other signal processing circuit. Substrate 200 may also contain IPDs, such as inductors, capacitors, and resistors, for RF signal processing.

An electrically conductive layer 208 is formed over substrate 200 using PVD, CVD, electrolytic plating, electroless plating process, or other suitable metal deposition process. Conductive layer 208 can be one or more layers of Al, Cu, Sn, Ni, Au, Ag, or other suitable electrically conductive material. Conductive layer 208 operates as contact pads electrically connected to interconnect structure 202 and/or the circuits on active surface 206.

A screen or stencil 210 is disposed over substrate 200 with openings 212 in the stencil. A volume of conductive ink 214 is deposited over stencil 210 in a printing process. In one embodiment, conductive ink 214 contains powdered or flaked silver or carbon conductive materials applied as a thin layer. A conductive ink distribution tool or squeegee 216 distributes conductive ink 214 across stencil 210 and into openings 212. During the printing operation, conductive ink distribution tool 216 moves left to right across stencil 210 as shown by arrow 218 to press conductive ink 214 through openings 212 in the stencil to contact conductive layer 208. Conductive ink 214 is evenly dispensed and uniformly distributed within openings 212, as shown in FIG. 8b. Excess conductive ink 214 can be removed to planarize the conductive ink. Stencil 210 is removed.

In another embodiment, a volume of conductive ink 214 is deposited directly into openings 212 using dispensing nozzle or jet 218, as shown in FIG. 8c. During the jetting operation, conductive ink 214 flows from dispensing nozzle 218 as droplets or steady stream over conductive layer 208.

FIG. 8d shows conductive ink 214 deposited over conductive layer 208 by operation of conductive ink distribution tool 216, dispensing nozzle 218, or other suitable applicator for dispensing or distributing the conductive ink. Conductive ink 214 is evenly dispensed and uniformly distributed over conductive layer 208.

UV light source 220 radiates UV light 222 onto conductive ink 214 at room temperature (15-25° C.) causing a chemical crosslinking reaction to cure the conductive ink. An elevated temperature is not required for the UV cure. The radiation curable conductive ink 214 can be applied at the wafer level to form wiring traces or RDL over substrate 200. The formation of wiring traces or RDL using conductive ink 214 is simple, fast, low cost, and applies to a portion of substrate 200 or a large area, e.g., the entirety, of the substrate.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor die;
    depositing an encapsulant around the semiconductor die;
    forming a first insulating layer over the semiconductor die;
    forming a patterned trench in the first insulating layer and encapsulant;
    depositing a conductive ink in the patterned trench in the first insulating layer and encapsulant;
    planarizing the conductive ink with the first insulating layer and the encapsulant; and
    curing the conductive ink by ultraviolet light at room temperature to form a redistribution layer in the patterned trench.

2. The method of claim 1, wherein depositing the conductive ink includes:
    disposing a stencil over the first insulating layer with an opening in the stencil aligned with the patterned trench; and
    depositing the conductive ink through the opening in the stencil into the patterned trench.

3. The method of claim 1, wherein depositing the conductive ink includes dispensing the conductive ink through a nozzle into the patterned trench.

4. The method of claim 1, further including:
    forming a second insulating layer over the first insulating layer and conductive ink; and
    forming an interconnect structure over the conductive ink.

5. A method of making a semiconductor device, comprising:
    providing a substrate;
    forming a first insulating layer over the substrate;
    depositing an encapsulant around the substrate;
    forming a trench in the encapsulant and in the first insulating layer;
    depositing a conductive ink in the trench in the encapsulant;
    curing the conductive ink by ultraviolet light to form a redistribution layer in the trench;
    forming a second insulating layer over the first insulating layer and redistribution layer; and
    forming an interconnect structure over the redistribution layer.

6. The method of claim 5, further including curing the conductive ink at room temperature.

7. The method of claim 5, wherein depositing the conductive ink includes:
    disposing a stencil over the first insulating layer; and
    depositing the conductive ink through the stencil into the trench.

8. The method of claim 5, wherein depositing the conductive ink includes dispensing the conductive ink through a nozzle into the trench.

9. The method of claim 5, further including measuring a volume of the conductive ink according to a size of the trench, wherein depositing the conductive ink includes dispensing the volume of the conductive ink measured according to the size of the trench.

10. The method of claim 5, further including planarizing the conductive ink with the first insulating layer and the encapsulant.

11. A semiconductor device, comprising:
    a semiconductor die;
    an encapsulant deposited around the semiconductor die;
    a first insulating layer formed over the semiconductor die;
    a patterned trench formed in the first insulating layer and encapsulant; and
    a conductive ink deposited in the patterned trench and planarized with the first insulating layer and encapsulant, wherein the conductive ink is cured by ultraviolet light.

12. The semiconductor device of claim 11, further including a stencil disposed over the first insulating layer, wherein the conductive ink is deposited through the stencil into the patterned trench.

13. The semiconductor device of claim 11, further including a nozzle disposed over the patterned trench, wherein the conductive ink is dispensed through the nozzle into the patterned trench.

14. The semiconductor device of claim 11, wherein the conductive ink is cured at room temperature.

15. The semiconductor device of claim 11, further including:
    a second insulating layer formed over the first insulating layer and conductive ink; and
    an interconnect structure formed over the conductive ink.

16. A semiconductor device, comprising:
    a substrate;
    a first insulating layer formed over the substrate;
    an encapsulant deposited around the substrate;
    a trench formed in the first insulating layer and in the encapsulant;
    an ultraviolet (UV) curable conductive ink deposited in the trench in the first insulating layer and the encapsulant as a redistribution layer formed in the trench;
    a second insulating layer formed over the first insulating layer and redistribution layer; and
    an interconnect structure formed over the redistribution layer.

17. The semiconductor device of claim 16, wherein the UV curable conductive ink is cured by ultraviolet light.

18. The semiconductor device of claim 16, wherein the UV curable conductive ink is cured at room temperature.

19. The semiconductor device of claim 16, wherein the UV curable conductive ink includes flaked silver or carbon conductive materials.

20. The semiconductor device of claim 16, further including the UV curable conductive ink planarized with the first insulating layer and the encapsulant.

21. A method of making a semiconductor device, comprising:
    providing a substrate;
    forming a first insulating layer over the substrate;
    forming a trench in the first insulating layer;
    depositing a conductive ink in the trench in the first insulating layer; and curing the conductive ink by ultraviolet light to form a redistribution layer in the trench.

22. The method of claim 21, further including measuring a volume of the conductive ink according to a size of the trench, wherein depositing the conductive ink includes dispensing the volume of the conductive ink measured according to the size of the trench.

23. The method of claim 21, wherein depositing the conductive ink includes:
   disposing a stencil over the first insulating layer; and
   depositing the conductive ink through the stencil into the trench.

24. The method of claim 21, wherein depositing the conductive ink includes dispensing the conductive ink through a nozzle into the trench.

25. The method of claim 21, further including curing the conductive ink at room temperature.

26. The method of claim 21, further including planarizing the conductive ink with the first insulating layer.

* * * * *